United States Patent [19]
Udell, Jr.

[11] Patent Number: 5,291,495
[45] Date of Patent: Mar. 1, 1994

[54] METHOD FOR DESIGNING A SCAN PATH FOR A LOGIC CIRCUIT AND TESTING OF THE SAME

[75] Inventor: Jon G. Udell, Jr., Fort Collins, Colo.

[73] Assignee: NCR Corporation, Dayton, Ohio

[21] Appl. No.: 729,282

[22] Filed: Jul. 12, 1991

[51] Int. Cl.⁵ .......................................... G01R 31/28
[52] U.S. Cl. ..................................... 371/22.3; 371/23
[58] Field of Search ........................... 371/22.3, 23; 324/158 R

[56] References Cited

U.S. PATENT DOCUMENTS

| | | | |
|---|---|---|---|
| 3,761,695 | 9/1973 | Eichelberger | 371/22.3 |
| 4,000,460 | 12/1976 | Kadakia et al. | 324/73 R |
| 4,074,851 | 2/1978 | Eichelberger et al. | 371/22.3 |
| 4,534,028 | 8/1965 | Trischler | 371/22.3 |
| 4,698,588 | 10/1987 | Hwang et al. | 324/73 R |
| 4,754,215 | 6/1988 | Kawai | 324/73 R |
| 4,872,169 | 10/1989 | Whetsel, Jr. | 371/22.3 |
| 4,894,830 | 1/1990 | Kawai | 371/22.3 |
| 4,897,837 | 1/1990 | Ishihara et al. | 371/22.3 |
| 4,897,838 | 1/1990 | Tateishi | 371/22.3 |
| 4,929,889 | 5/1990 | Seiler et al. | 371/22.3 |
| 4,937,765 | 6/1990 | Shupe et al. | 371/25.1 |
| 5,202,889 | 4/1993 | Aharon et al. | 371/27 |

OTHER PUBLICATIONS

Cross-Check Technology Brochure, Solve ASIC Testability with Cross-Check Technology, Nov. 1988.

*Primary Examiner*—Charles E. Atkinson
*Attorney, Agent, or Firm*—Douglas S. Foote

[57] ABSTRACT

A method for designing a scan path to connect flip-flops in a logic circuit. Test patterns are created by the circuit designer. The circuit and test patterns are then simulated to determine potential faults in the circuit which are not detected by the patterns and not observable at any flip-flop in the circuit. The number of such faults is then reduced. For example, the test patterns can be modified and/or redundant circuit elements can be removed. A subset of flip-flops where undetectable faults are observable are then identified and connected in a scan path. Scan times can also be selected. The method may be extended to include the actual testing of the logic circuit.

20 Claims, 3 Drawing Sheets

METHOD FOR DESIGNING A SCAN PATH FOR A LOGIC CIRCUIT AND TESTING OF THE SAME

The present invention relates to a method for designing and testing logic circuits.

CROSS-REFERENCE TO RELATED APPLICATIONS

"Method And System For Fault Testing A Logic Circuit", U.S. patent application Ser. No. 07/729,528, filed concurrently herewith, invented by Jon G. Udell, Jr.

BACKGROUND OF THE INVENTION

The testing of a logic circuit generally includes two related tests: a functional test and a fault test. The functional test involves the application of various test patterns to the primary inputs of the circuit and a monitoring of the output signals. The output signals are compared to expected values to verify logic levels and timing The fault test determines whether the circuit contains fabrication errors. The fault test is usually designed to detect as many faults as possible in a particular "fault model". Often, the "single stuck-at" fault model is used, where each fault corresponds to an input or output of a logic gate or other element in the circuit becoming fixed at a particular logic state.

As the functional test and fault test are related, they are sometimes combined If there is a fault in the circuit, it is possible that it will show up during the functional test. "Fault coverage" is a phrase which is commonly used to express how many or what percentage of potential faults in a given fault model would be detected during a test. As the complexity of circuits increases there is often a decrease in the fault coverage of the functional test. The reason that fault coverage is less than 100% is that many potential fault sites in a complex circuit are relatively inaccessible. In other words, a long sequence of test patterns may be required to propagate or reveal the fault at a primary circuit output. As the number of inaccessible fault sites increases, the time required to develop test patterns and to test the circuit becomes excessive.

Another approach to fault testing is the use of a scan path. A scan path is a serial connection of various sequential elements (flip-flops, latches, etc.) in the circuit The scan path normally has its own input and output pins The scan path elements are modified during the circuit design so that logical values (scan patterns) may be serially shifted into and out of the elements This allows the elements to be preloaded with selected logic values and their contents to be removed and examined during testing If a scan path connects all of the sequential elements in a circuit it is referred to as "full scan." Full scan provides good fault coverage but requires a correspondingly high amount of chip space to accommodate the scan path. If the scan path connects only some of the sequential elements in the circuit it is referred to as "partial scan." Partial scan requires less chip space but obviously allows direct access to fewer sequential elements.

Critical issues for the testing of logic circuits are the design of test patterns for the functional test and the design of the scan path and scan patterns. Typically, the circuit designer first develops test patterns for functional testing The test patterns and circuit design are then provided to an automatic fault simulator. The fault simulator determines which faults in the fault model are not detected by the functional test. The fault simulator achieves this by simulating each fault while applying the test patterns Faults which are not detected are identified in a list of undetected faults.

In order to obtain greater fault coverage, a fault test is often used in addition to the functional test. This test can be written by the circuit designer, a test expert, or can be generated by an automatic test pattern generator. The test pattern generator, a software program, automatically generates sequences of additional test patterns to reduce the number of undetected faults. The problem with this approach is that the automatically generated test patterns sequences are frequently long and often only detect a single fault. To reach a desired level of fault coverage, an excessive number of test patterns may be required. An additional problem with automatic test pattern generators is that they may require the circuit designer to have extensive knowledge of their operation. Finally, even when operated by a knowledgeable user, the test pattern generator may not be capable of achieving the desired fault coverage in a reasonable amount of time.

If a scan path is to be employed, some automatic test pattern generators also provide guidance on which sequential elements in the circuit to combine in a scan path. For both partial and full scan paths, such test pattern generators provide test patterns and patterns for the scan path. However, even with the use of scan paths, test pattern generation often results in long sequences of test patterns which can greatly increase the testing time for a circuit.

OBJECTS OF THE INVENTION

It is therefore an object of the present invention to provide a method for selecting test patterns for a logic circuit.

It is another object of the present invention to provide a new and improved method for designing a scan path for a logic circuit.

It is a further object of the present invention to provide a new and improved method for testing a logic circuit.

It is a yet another object of the present invention to increase the fault coverage during functional testing of a logic circuit.

It is yet a further object of the present invention to reduce the time required to test a logic circuit.

It is still another object of the present invention to utilize knowledge of the design of a logic circuit in designing a scan path for the circuit.

It is still a further object of the present invention to reduce the number of scan elements in a scan path.

SUMMARY OF THE INVENTION

One form of the present invention is a method for designing a scan path to connect sequential devices, such as flip-flops, in a logic circuit Undetected faults in the circuit are determined with the use of test patterns. Sequential devices are identified where the undetected faults are observable. A subset of the identified sequential devices is then selected for connection in a scan path.

In another form, test patterns which can check the functional operation of the circuit are created by the circuit designer The circuit and test patterns are then simulated to determine potential faults in the circuit which are not detected by the patterns and which are not observable at any flip-flop in the circuit. The number of such faults is then reduced. For example, the test patterns can be modified and/or redundant circuit elements can be removed. A subset of flip-flops where undetectable faults are observable are then identified and connected in a scan path.

Another form of the invention is a method for testing the above described logic circuit. The current test patterns are applied to primary circuit inputs to change the logical values of one or more elements in the scan path. The logical values of the scan path elements are temporarily transferred for observation when necessary to detect the faults.

DESCRIPTION OF A PREFERRED EMBODIMENT

Figure 1:
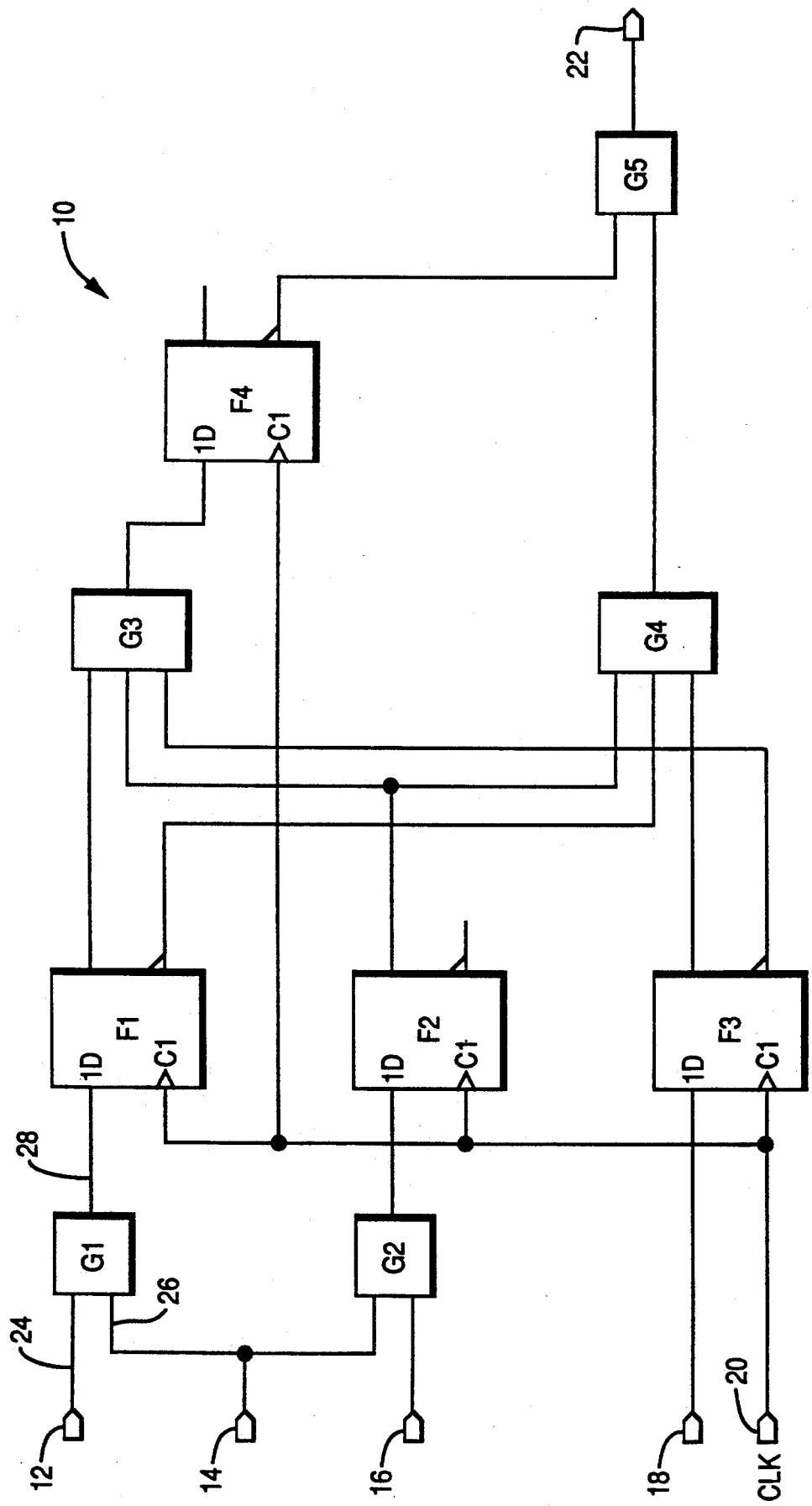
FIG. 1 is a circuit diagram of a simplified logic circuit.

FIG. 1 shows logic elements and connecting lines for a simplified circuit 10. The elements include combinational logic gates G1, G2, G3, G4 and G5, and flip-flops F1, F2, F3 and F4. The elements are connected between primary inputs 12, 14, 16, 18 and 20 and primary output 22.

Various faults may be created during the production of circuit 10. A typical "stuck-at" fault causes an input or output (fault site) of a logic gate or other element in the circuit to become fixed at a particular logic state. For example, fault sites 24 and 26 are the input lines to gate G1, and fault site 28 is the output line from gate G1. Each fault site has two possible faults: stuck at 1 and stuck at 0. For example, if fault site 24 is shorted to a power line it will have a stuck at 1 fault, if it is grounded it will have a stuck at 0 fault.

The functional testing of circuit 10 involves the application of a sequence of logic signals (also referred to as test patterns) to selected ones of inputs 12, 14, 16, 18 and 20 and the monitoring of output 22. Functional testing is used to confirm the expected logical output and timing of circuit 10 to various input signals. Functional testing will also detect faults at various fault sites However, most functional tests will not detect faults at every fault site. To provide complete fault coverage, additional testing could be performed with further test patterns The development and application of these further test patterns can be unduly time consuming, particularly for complex circuits.

Figure 2:
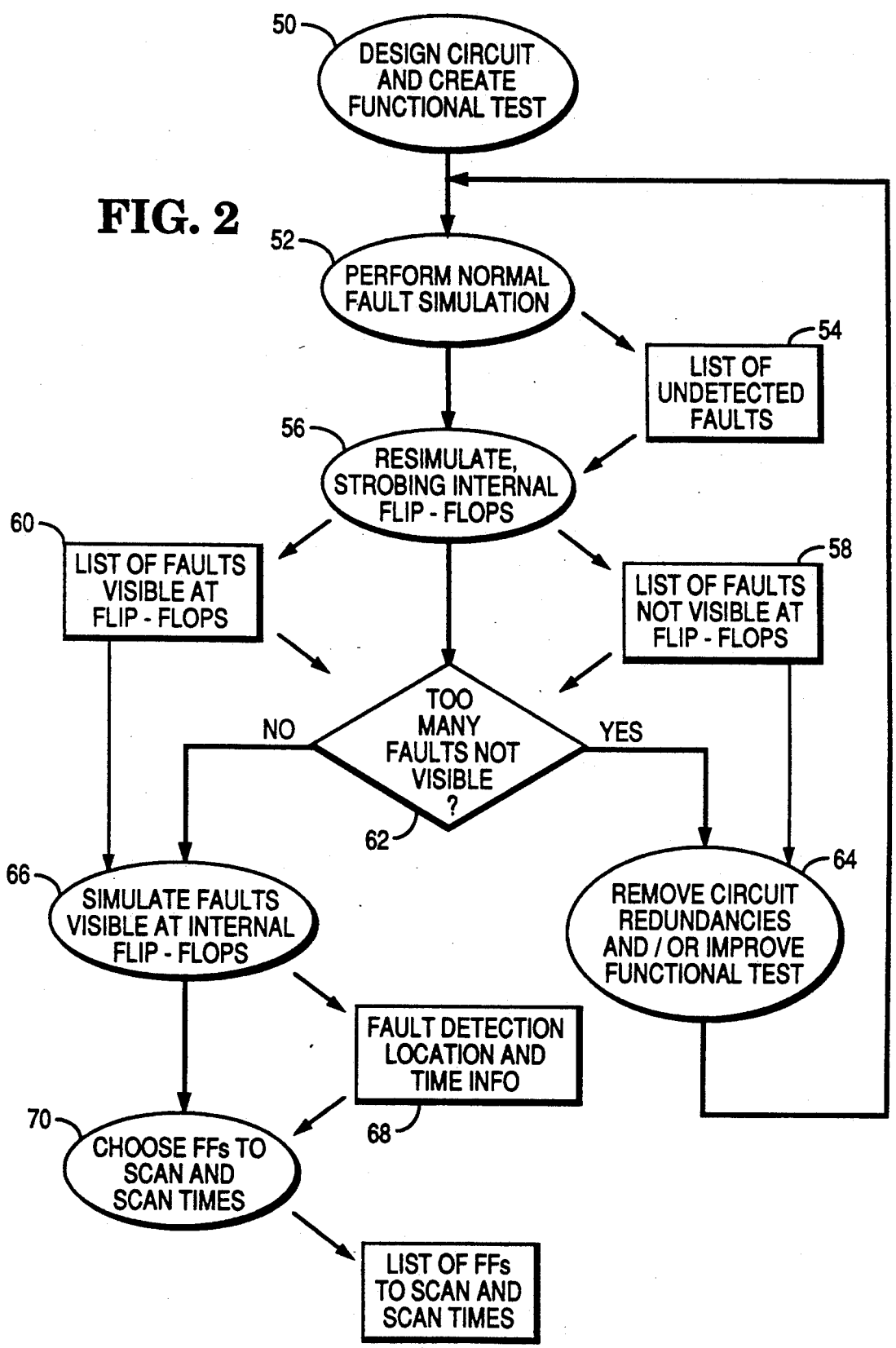
FIG. 2 is a flow chart illustrating the method according to one form of the present invention.

FIG. 2 is a flow chart which illustrates a method of designing a scan path to connect flip-flops in a logic circuit. The circuit design and creation of an initial functional test (bubble 50) is conventional. A functional test requires the creation of test patterns which can check the functional operation the circuit. A test pattern is a sequence of logical values which are applied to one or more of the primary inputs of a circuit to verify its operation. It should be appreciated that at this point in the process the test patterns are not yet ready to be used to test the circuit.

A typical fault simulation of the circuit and test patterns is depicted by bubble 52. The test patterns and a model of the circuit are provided as inputs to an automatic fault simulator. For example, the automatic fault simulator could be the Verifault software program available from Cadence. The automatic fault simulator simulates each possible fault in the circuit in conjunction with the test patterns to determine if the faults are detected at primary circuit outputs. At the completion of the simulation, the program generates a list of any undetected faults. This list is represented in FIG. 2 as block 54.

The test patterns, circuit model and list of undetected faults are next provided to the fault simulator. The undetected faults are resimulated. (bubble 56) It is known from the previous simulation that the effects of these faults will not be detected at the primary circuit output(s). Thus, in the present simulation, the flip-flops are strobed or monitored to determine whether the undetected fault propagates thereto (Flip-flops are monitored because they can be linked in a scan path. Any fault which propagates to a flip-flop in a scan path will be observable by shifting it out of the path.) The fault simulator can provide a list of the faults which are not detected by the test patterns and which are not observable at any flip-flop in the circuit. This list of undetected, non-observable faults is represented by block 58. The fault simulator can also provide a list of the faults which are not detected by the test patterns but which are observable at flip-flops in the circuit. This list of undetected, observable faults is represented by block 60.

The number of undetected, non-observable faults is compared against a predetermined number (which can be in the form of an absolute number or percentage) (diamond 62). If the predetermined number is exceeded, the list of undetected, non-observable faults is used to reduce the number of such faults. In a preferred embodiment, this list is provided to the circuit designer who has several options. (bubble 64) One option is to modify the test patterns to exercise the fault sites which are the source of the undetected and non-observable faults such that the fault effects are propagated to flip-flops or beyond. (If desired, the test patterns can be randomly generated.) Another option is to examine the circuit to determine whether there are any redundant logic elements which can be removed. If so, some redesigning of the circuit may be appropriate An advantage of the present invention is that it utilizes the knowledge of the circuit designer in developing and modifying test patterns and/or removing redundant circuit logic. The designer is not; however, required to propagate fault effects all the way to circuit outputs. In addition, it does not require the designer to have knowledge of the operation of an automatic test pattern generator.

What has been described is a process for simulating the circuit and test patterns to determine potential faults in the circuit which are not detected by the patterns and not observable at any flip-flop in the circuit. (bubbles 52 and 56). This process is repeated until the number of such faults is less than the predetermined number. For each subsequent simulation, any fault which is observable at a flip-flop need not be simulated again to the extent that there has been no alteration in its precipitating test patterns.

Figure 3:
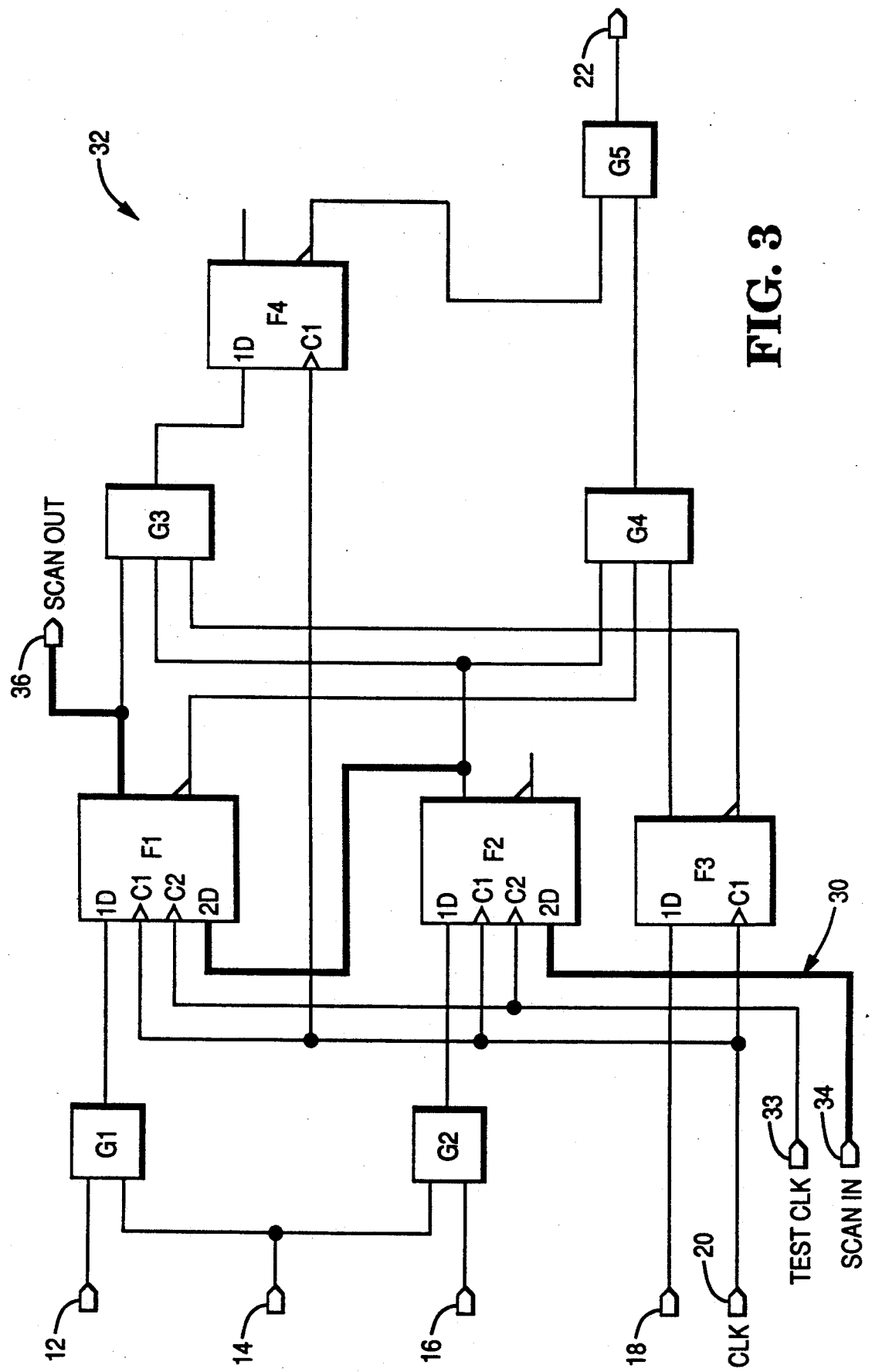
FIG. 3 is a circuit diagram of the circuit in FIG. 2 with the addition of a partial scan path.

The list of undetected, observable faults (block 60) is now provided to the fault simulator to identify the flip-flops where undetectable faults are observable. (bubble 66). Because some faults will be observable at more than one flip-flop and at different times depending upon the test patterns, it is preferred that a set of flip-flops be identified where all such faults are observable. This can be either all of the identified flip-flops or a subset which includes the most prominent or important of the flip-flops. The information generated during simulation (block 68) can be used to select this set of flip-flops to be connected in a scan path. (bubble 70) The designer can then design a scan path which connects the identified flip-flops. Furthermore, the simulation will determine the times during the application of the test patterns when the undetectable faults are also observable at the identified flip-flops. (block 68) This information can be used to select a set of times for scanning the circuit The set of times selected is normally a subset of the identified times, with a minimum number of scan times being chosen to permit detection of all faults Preferably, both the number of chosen flip-flops and the number of scan times will be minimized FIG. 3 shows a partial scan path 30 that has been added to the circuit shown in FIG. 1.

After a circuit has been produced, the (possibly modified) functional test patterns are applied to the primary circuit inputs The primary output(s) of the circuit will be monitored and compared to expected results. The test patterns will also change the logical values of various elements in the circuit including, at some point during the test, the logical values of various flip-flops in the scan path. At various times (identified previously in bubble 70), the functional test will be interrupted and the logical values of the flip-flops in the scan path will be temporarily transferred out for observation. The values of the flip-flops are returned to their respective flip-flops immediately, via the scan path, and the functional test continued. In this manner, the scan path is used solely for observation purposes, and the functional test is interrupted only at the times predetermined in block 68.

It will be clear to those skilled in the art that the present invention is not limited to the specific embodiment disclosed and illustrated herein For example, the method described can be used if a full scan path is implemented in the circuit. As with partial scan, the circuit and test patterns are simulated to develop a list of undetected, non-observable faults. This list is used by the designer to remove redundant circuit elements and/or improve the functional test. The time to observe the state of the flip-flops is also determined.

A typical application of the present invention is in the design and testing of an integrated circuit on a semiconductor chip, either digital or mixed digital and analog. However, it also has application to multi-chip modules and board designs. It should also be clear that the invention applies equally to the design of multiple scan paths connecting respective groups of selected elements in the circuit.

It is also possible to combine or split apart various steps of the invention. For example, a single simulation may by used for both bubbles 52 and 56. The simulation step of bubble 66 can also be split into two steps: one to determine fault detection information, and one to determine time information. This significantly reduces the amount of data that must be stored in block 68, and allows the scan chain to be chosen prior to gathering the time information.

Numerous modifications, variations, and full and partial equivalents can be undertaken without departing from the invention as limited only by the spirit and scope of the appended claims.

What is desired to be secured by Letters Patent of the United States is as follows.

What is claimed is:

1. A method for designing a scan path to connect sequential devices in a logic circuit comprising:
   determining undetected faults in said circuit with the use of test patterns;
   identifying sequential devices where the undetected faults are observable; and
   selecting a subset of the identified sequential devices for connection in a scan path.

2. The method of claim 1 wherein said undetected faults are determined by simulating said circuit and test patterns.

3. The method of claim 2 further comprising:
   reducing the number of undetected faults.

4. The method of claim 3 wherein said reducing step includes modifying the test patterns 5. The method of claim 3 wherein said reducing step includes removing redundant circuit elements.

6. The method of claim 2 wherein said simulating includes:
   providing said test patterns and a model of said circuit to an automatic fault simulator; and
   generating a list of undetected faults therefrom.

7. The method of claim 6 wherein said simulating further includes:
   providing said test patterns, model and list to said fault simulator; and
   generating a list of faults not observable at any of said sequential devices therefrom.

8. The method of claim 1 wherein said identifying step further includes:
   determining the times during the application of said test patterns when said undetectable faults are observable at said sequential devices.

9. A method for designing a scan path to connect flip-flops in a logic circuit comprising:
   creating test patterns which can check the functional operation of said circuit;
   simulating said circuit and test patterns to determine potential faults in said circuit which are not detected by said patterns and not observable at any flip-flop in said circuit, said step including:
   providing said test patterns and a model of said circuit to an automatic fault simulator;
   generating a list of undetected faults therefrom;
   providing said test patterns, model and list to said fault simulator; and
   generating a list of faults not observable at any of said flip-flops therefrom;
   reducing the number of such faults by modifying the test patterns or removing redundant circuit elements;
   identifying flip-flops where undetectable faults are observable;
   determining the times during the application of said test patterns when said undetectable faults are observable at identified flip-flops;
   selecting a subset of said times for observing said faults; and
   selecting a subset of the identified flip-flops for connection in a scan path.

10. A method for designing a scan path to connect flip-flops in a logic circuit comprising:
    creating test patterns which can check the functional operation of said circuit;

simulating said circuit and test patterns to determine potential faults in said circuit which are not detected by said patterns and not observable at any flip-flop in said circuit;

repeating the preceding steps b modifying said test patterns to reduce the number of such faults to less than a predetermined number;

identifying flip-flops where undetectable faults are observable; and connecting selected ones of the identified flip-flops in a scan path.

11. A method for designing a scan path to connect flip-flops in a logic circuit comprising:
   a. creating test patterns which can check the functional operation of said circuit;
   b. simulating said circuit and test patterns to determine potential faults in said circuit which are not detected by said patterns and not observable at any flip-flop in said circuit;
   c. using such faults to identify redundant circuit elements;
   d. redesigning said circuit by removing the redundant elements;
   e. simulating said redesigned circuit and test patterns to determine potential faults which are not detected by said patterns and not observable at any flip-flop in said redesigned circuit;
   f. repeating steps c through e to reduce the number of such faults to less than a predetermined number;
   g. identifying flip-flops where undetectable faults are observable; and
   h. connecting identified flip-flops in a scan path.

12. A method for testing a logic circuit having inputs and flip-flops, comprising:

creating test patterns which can check the functional operation of said circuit;

simulating said circuit and test patterns to determine potential faults in said circuit which are not detected by said patterns and not observable at any flip-flop in said circuit;

reducing the number of such faults by modifying the test patterns or removing redundant circuit elements;

identifying flip-flops where undetectable faults are observable;

connecting identified flip-flops in a scan path;

applying the current test patterns to said inputs to change the logical values of one or more elements in said scan path; and temporarily transferring the logical values for observation.

13. The method of claim 12 further comprising in connection with said identifying step:

determining the times during the application of said test patterns when said undetectable faults are observable at identified flip-flops; and 14. A method for determining which sequential devices in a circuit should be included in scan paths, comprising:

simulating test patterns and said circuit to determine which faults are undetected at the circuit outputs;

identifying sequential devices where undetected faults are observable; and selecting a subset of the identified sequential devices at which a predetermined number of said undetected faults are observable.

15. The method of claim 14 wherein said test patterns are selected to check the functional operation of the circuit.

16. The method of claim 14 wherein said test patterns are randomly generated.

17. The method of claim 14 wherein prior to said selecting step:

identifying any undetected faults which are non-observable at said sequential devices; and reducing the number of such undetected and non-observable faults.

18. The method of claim 17 wherein said reducing step includes modifying the test patterns.

19. The method of claim 17 wherein said reducing step includes modifying the circuit to remove redundant logic.

20. A method for designing a test for a logic circuit having sequential devices connected by a scan path comprising:

simulating test patterns and said circuit to determine times at which faults not detected at outputs of the circuit are observable at said sequential devices; and selecting a subset of said times for observing said faults.

* * * * *

UNITED STATES PATENT AND TRADEMARK OFFICE
CERTIFICATE OF CORRECTION

PATENT NO. : 5,291,495
DATED : March 1, 1994
INVENTOR(S) : Jon G. Udell, Jr.

It is certified that error appears in the above-identified patent and that said Letters Patent is hereby corrected as shown below:

Column 7, Line 5, delete "b" and insert -- by --.

Column 8, Line 10, insert on next line after ";and" -- selecting a subset of said times for observing said faults.--

Signed and Sealed this

Fourth Day of October, 1994

Attest:

BRUCE LEHMAN

Attesting Officer

Commissioner of Patents and Trademarks